United States Patent [19]

Namiki et al.

[11] Patent Number: 5,482,174

[45] Date of Patent: Jan. 9, 1996

[54] METHOD FOR REMOVING COPPER OXIDE ON THE SURFACE OF A COPPER FILM AND A METHOD FOR PATTERNING A COPPER FILM

[75] Inventors: Takahisa Namiki; Yasuo Yamagishi; Ei Yano, all of Kawasaki, Japan

[73] Assignee: Fujitsu Limited, Kanagawa, Japan

[21] Appl. No.: 253,559

[22] Filed: Jun. 3, 1994

[30] Foreign Application Priority Data

Aug. 2, 1993 [JP] Japan .................................. 5-191274

[51] Int. Cl.$^6$ ............................ B44C 1/22; C23F 1/00
[52] U.S. Cl. ........................ 216/41; 216/92; 216/101; 216/106; 134/27
[58] Field of Search ............................ 156/629, 637, 156/656, 659.1, 667; 134/3, 27, 32, 33, 34; 252/79.2, 79.4, 79.5, 142, 156; 216/13, 41, 91, 92, 96, 101, 105, 106, 108

[56] References Cited

U.S. PATENT DOCUMENTS

| | | | |
|---|---|---|---|
| 2,326,837 | 8/1943 | Coleman | 134/27 |
| 3,067,070 | 12/1962 | Louck | 134/27 |
| 3,072,502 | 1/1963 | Alfano | 134/27 |

FOREIGN PATENT DOCUMENTS

| | | |
|---|---|---|
| 53-142671 | 12/1978 | Japan . |
| 58-11789 | 1/1983 | Japan . |
| 63-52499 | 3/1988 | Japan . |
| 3-217077 | 9/1991 | Japan . |
| 4-151898 | 5/1992 | Japan . |

*Primary Examiner*—William Powell
*Attorney, Agent, or Firm*—Nikaido, Marmelstein, Murray & Oram

[57] ABSTRACT

A method for removing copper oxide on a surface of a copper film is comprising the steps of treating the surface of the copper film with acid, neutralizing the surface of the copper film treated with acid, and washing the neutralized surface of the copper film.

16 Claims, 2 Drawing Sheets

ACID SOLUTION

NEUTRALIZING SOLUTION

WASHING SOLUTION

ACID SOLUTION

NEUTRALIZING SOLUTION

WASHING SOLUTION

METHOD FOR REMOVING COPPER OXIDE ON THE SURFACE OF A COPPER FILM AND A METHOD FOR PATTERNING A COPPER FILM

BACKGROUND OF THE INVENTION

1. Field of the Invention

The present invention relates to a method for removing copper oxide on the surface of a copper film for wiring and a method for patterning a copper film, and more particularly to a method for removing copper oxide naturally or artificially formed on the surface of a copper wiring used in a printed wiring board or an LSI and a method for patterning a copper film.

2. Description of the Prior Art

Copper is widely used as a wiring material since it is low electrical resistance and easy to process and inexpensive in cost.

However, copper has a demerit that it is easily oxidized in the air to form copper oxide on the surface of a copper film. When copper is used as a wiring material, therefore, the wiring is liable to become high in resistance or liable to break because of copper oxide formed on the surface of the wiring.

On the other hand, it is described in Japanese Patent Laid-open disclosure (KOKAI) Sho 58-11789, Sho 63-52499, Sho 3-217077, Hei 4-151898, and the like to positively form copper oxide on the surface of a copper film in order to improve adhesion of photoresist or resin to a copper film.

However, since copper and copper oxide are different from each other in such chemical properties as solubility, etching characteristic, and the like, existence of a copper oxide layer causes a wiring pattern to be deteriorated in accuracy in case of making a wiring through patterning a copper film by means of a photolithography method.

Copper oxide is soluble in both of alkali and acid. Therefore, when patterning of a copper film, the copper oxide existing under a resist film to act as a mask for the copper film is dissolved in an etchant to deteriorate the wiring pattern in accuracy. And in case of plating of a copper wiring, it causes the wiring pattern to be deteriorated in accuracy due to the copper oxide formed on the surface of the copper wiring, which dissolves in the plating solution.

It is said that oxidation of the surface of a copper film progresses even in a high vacuum and a copper oxide film of 20 to 30 Å in thickness is formed in a usual vacuum condition.

When the inventors of the invention actually measured thickness of copper oxide films formed on the surface of copper films which have been just formed by vacuum deposition by means of an X-ray photoelectron spectroscope, any sample was not found whose copper oxide film was less than 20 Å in thickness.

However, as a usual condition of photolithography for making a wiring of a copper film, generation of a copper oxide film of 20 to 30 Å in thickness is no problem.

However, actually the growth of copper oxide (film) makes more progress or advances in general so that it becomes greater than 30 Å in thickness without stopping at a degree of thickness of a copper oxide film made under a condition of high vacuum.

Such oxidation of copper as this is also daily seen. For example, such oxidation is made easy to understand by recalling a fact that a copper coin which has an intense metallic gloss immediately after being issued becomes reddish brown as the days pass. Actually copper coins are made of copper alloy, but their oxidation behavior is similar to copper.

Oxidation of copper progresses faster in case that the copper is placed in a high-temperature and high-humidity environment, in case that there is acid or alkali on the surface of the copper or in the atmosphere around it, or in case that there is hydrogen sulfide, sulfur dioxide, high-density carbon disulfide, or the like in the atmosphere around the copper.

A method of etching the surface of copper with acid is generally used as a method for removing copper oxide film on the surface of the copper. Many examples using such a method in printed copper wiring boards are actually seen.

However, since acid is intensely adsorbed onto the surface of a copper film due to high activity of copper, it is difficult to completely remove the residual acid on the surface of the copper film by means of simple washing with water. The residual acid not only acts as a catalyzer which prompts corrosion or oxidation of the copper itself but also causes other materials around it to be corroded. Therefore, even if the copper oxide has been removed with acid, oxidation of the surface of the copper film is progressed or advanced still further after removal of the copper oxide. This is similar to a fact that a reddish brown copper coin takes back a metallic gloss when it is washed with acid but after this it is more rusted than before washing.

In case of forming a copper wiring, therefore, even when patterning a copper film after removing copper oxide on the surface of the copper film with acid and then washing its surface with water, such a failure that the copper wiring becomes high electrical resistance or is broken happens after the patterning.

SUMMARY OF THE INVENTION

It is an object of the present invention to provide a method for removing copper oxide on the surface of a copper film which includes a process of suppressing progress or advance of oxidation after removing the copper oxide on the surface of the copper film with acid and a method for patterning a copper film which includes a process of suppressing the progress of oxidation.

According to the present invention there is provided a method for removing copper oxide on the surface of a copper film comprising three steps of treating with acid, neutralizing, and washing, thereby molecules of acid and alkali are not remained on the surface of the copper film after removing the copper oxide, and as a result progress of oxidation after removing the copper oxide is suppressed.

And since a series of these steps are performed as turning round or rotating the copper film on a substrate plane by means of a spinner or the like used for developing resist, solutions supplied onto the surface of the copper film is easily removed by the centrifugal force and a series of steps for removing the copper oxide are finished in a short time. Furthermore, by drying the surface of the copper film as keeping turn or rotating on the substrate after finishing these steps, an extra drying process is made unnecessary.

By keeping the normal concentration of an acid solution used in the treating with acid and that of a neutralizing solution used in the neutralizing in a range of from 0.01 to 10 normality, these steps are quickly performed and any part other than the copper film is not damaged.

By using organic solvents for solutions used in the treating with acid and neutralizing steps or using an organic solvent for a solution used in the washing step, the possibility that water is remained on the surface of the copper film can be reduced.

DESCRIPTION OF THE PREFERRED EMBODIMENTS OF THE INVENTION

FIGS. 1A to 1D are cross sectional views of a sample showing a method of an embodiment of the invention.

First, a number of plate-shaped copper films 2 each of which has a copper oxide layer 1 of 150 Å in thickness formed on it are made as the samples for testing the copper oxide film removing method. Thickness of the copper oxide layer 1 was measured by means of an electron spectroscopy for chemical analysis (ESCA).

Figure 1A:
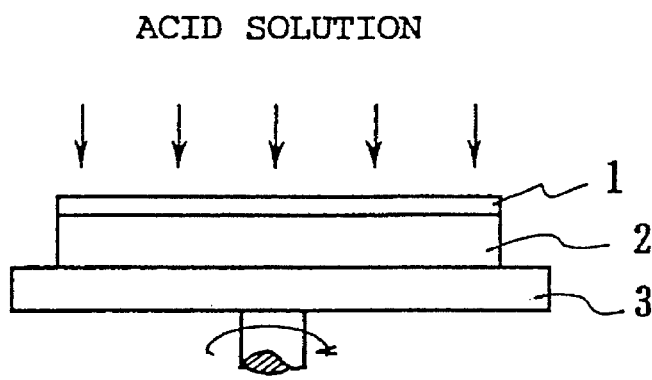
FIGS. 1A to 1D are cross sectional views showing one after another processes of removing copper oxide which relate to an embodiment of the invention.
Figure 1B:
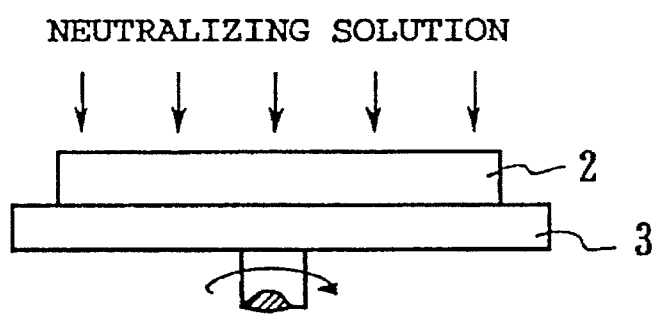
Figure 1C:
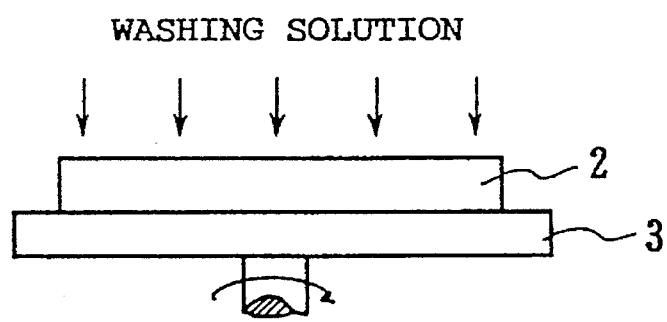
Figure 1D:
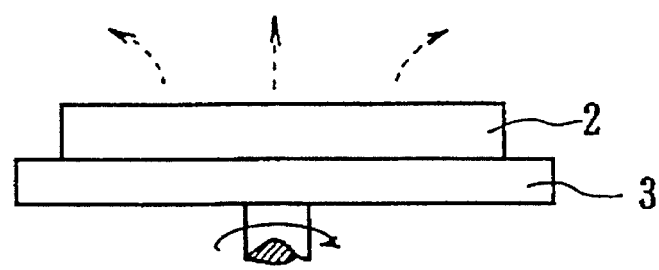

As shown in FIGS. 1A to 1C, an effect of removing the copper oxide layer 1 was examined in case of supplying one after another or sequentially an acid solution and neutralizing solution and washing solution to the sample. Furthermore, effects of removing the copper oxide layer were examined respectively in case of omitting supply of the neutralizing solution and in case of omitting supply of the washing solution. The acid solution was used for removing the copper oxide.

Such solutions as acid solution, neutralizing solution, washing solution, and the like are supplied one after another onto the copper film 2 set on the turning or rotating table 3 of a spinner generally used in the developing step of the photoresist.

Tables 1 to 5 show such conditions as kind of solutions supplied to the samples of the Process Numbers (1) to (10), supplying time of them, rotating speed of the spinner (spinning speed), and the like.

In a sample of Process Number (1) copper oxide was removed without a neutralization process, in a sample of Process Number (2) copper oxide was removed without a washing process, and in the other samples copper oxide was removed by performing one after another all of the acid process, neutralization process, and washing process.

Although not described in Tables 1 to 5, each washing time was set as 20 seconds and a rotating speed of the spinner in each washing process was set as 100 rpm. And as shown FIG. 1D, the surface of each sample was dried as keeping the rotating speed of the spinner at 1000 rpm immediately after the washing process had been finished. The drying time was 5 seconds. The sample of Process Number (2) which was not washed was dried immediately after the neutralization process.

Figure 2:
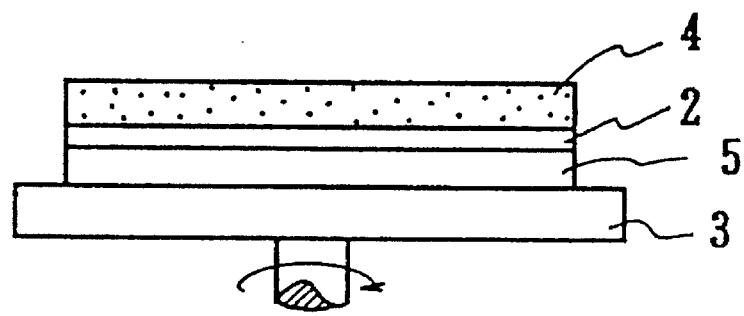
FIG. 2 is a cross sectional view showing a state in which photoresist is applied to the surface of a copper film after removing copper oxide on the surface of the copper film on a wiring board in an embodiment of the invention.

A copper film 2 is actually formed on a substrate and is patterned by means of a photolithography method and then is used as a wiring. In order to form a wiring by patterning the copper film 2, after removing the copper oxide 1 on the turning or rotating table 3 of the spinner by means of the same way as described above, resist 4 is applied to the copper film 2 formed on a printed wiring board 5 as shown FIG. 2, and after patterning the resist 4 through exposure and development, the copper film 2 is etched as using the patterned resist 4 as a mask.

[TABLE 1]

| A: Acid process B: Neutralization process C: Washing process | | | |
|---|---|---|---|
| | | Process Number | |
| | | (1) | (2) |
| A | Kind of acid | Sulfuric acid | Sulfuric acid |
| | Solvent | Isopropanol | Isopropanol |
| | Concentration (normality) | 1 | 1 |
| | Spinning speed (rpm) | 100 | 100 |
| | Time (second) | 10 | 10 |
| B | Kind of neutralizing agent | Without neutralization | Triethyl amine |
| | Solvent | | Isopropanol |
| | Concentration (normality) | | 1 |
| | Spinning speed (rpm) | | 100 |
| | Time (second) | | 10 |
| C | Kind of washing solution | Isopropanol | Without washing |

[TABLE 2]

| A: Acid process B: Neutralization process C: Washing process | | | |
|---|---|---|---|
| | | Process Number | |
| | | (3) | (4) |
| A | Kind of acid | Sulfuric acid | Sulfuric acid |
| | Solvent | Isopropanol | Isopropanol |
| | Concentration (normality) | 1 | 0.005 |
| | Spinning speed (rpm) | 100 | 100 |
| | Time (second) | 10 | 10 |
| B | Kind of neutralizing agent | Triethly amine | Triethyl amine |
| | Solvent | Isopropanol | Isopropanol |
| | Concentration (normality) | 1 | 0.005 |
| | Spinning speed (rpm) | 100 | 100 |
| | Time (second) | 10 | 10 |
| C | Kind of washing solution | Isopropanol | Isopropanol |

[TABLE 3]

| A: Acid process B: Neutralization process C: Washing process | | | |
|---|---|---|---|
| | | Process Number | |
| | | (5) | (6) |
| A | Kind of acid | Sulfuric acid | Benzene sulfonic acid |
| | Solvent | Isopropanol | Propanol |
| | Concentration (normality) | 20 | 1 |
| | Spinning speed (rpm) | 100 | 100 |
| | Time (second) | 10 | 10 |
| B | Kind of neutralizing agent | Triethyl amine | Pyridine |
| | Solvent | Isopropanol | Propanol |
| | Concentration (normality) | 20 | 1 |
| | Spinning speed (rpm) | 100 | 100 |
| | Time (second) | 10 | 10 |
| C | Kind of washing solution | Isopropanol | Propanol |

[TABLE 4]

A: Acid process B: Neutralization process C: Washing process

| | | Process Number | |
|---|---|---|---|
| | | (7) | (8) |
| A | Kind of acid | Paratoluene sulfoninc acid | Hydrochloric acid |
| | Solvent | Methylethyl ketone | Toluene |
| | Concentration (normality) | 1 | 1 |
| | Spinning speed (rpm) | 100 | 100 |
| | Time (second) | 20 | 20 |
| B | Kind of neutralizing agent | Pyridine hydrochloride | Potassium hydrogencarbonate |
| | Solvent | Methylethyl ketone | Water |
| | Concentration (normality) | 1 | 1 |
| | Spinning speed (rpm) | 100 | 100 |
| | Time (second) | 20 | 20 |
| C | Kind of washing solution | Methylethyl ketone | Ethanol |

[TABLE 5]

A: Acid process B: Neutralization process C: Washing process

| | | Process Number | |
|---|---|---|---|
| | | (9) | (10) |
| A | Kind of acid | Nitric acid | Benzene sulfonic acid |
| | Solvent | Propyl ether | Xylene |
| | Concentration (normality) | 1 | 1 |
| | Spinning speed (rpm) | 100 | 100 |
| | Time (second) | 20 | 20 |
| B | Kind of neutralizing agent | Pyridine sulfate | Benzene sulfonate |
| | Solvent | Propyl ether | Isopropanol |
| | Concentration (normality) | 1 | 1 |
| | Spinning speed (rpm) | 100 | 100 |
| | Time (second) | 20 | 20 |
| C | Kind of washing solution | Methylethyl ketone | Isopropanol |

Thickness of a copper oxide film 1 on the surface of a copper film 2 of each sample processed in the above-mentioned processes was measured by means of the ESCA. First, thickness of the copper oxide film 1 was measured after finishing the washing process or neutralization process of each sample and then was measured after leaving the sample in the air for 24 hours. As a result Table 6 was obtained.

[TABLE 6]

D: Process Number
(1) without neutralization, (2) without washing,
(4) $H_2SO_4$; 0.005 N, (5) $H_2SO_4$; 20 N

| | | Thickness of a copper oxide film | |
|---|---|---|---|
| | | Immediately after processing | 24 hours after processing |
| D | (1) | 25 | 100 |
| | (2) | 30 | 70 |
| | (3) | 25 | 40 |
| | (4) | 80 | 120 |

[TABLE 6]-continued

D: Process Number
(1) without neutralization, (2) without washing,
(4) $H_2SO_4$; 0.005 N, (5) $H_2SO_4$; 20 N

| | Thickness of a copper oxide film | |
|---|---|---|
| | Immediately after processing | 24 hours after processing |
| (5) | 20 | 30 |
| (6) | 30 | 30 |
| (7) | 25 | 30 |
| (8) | 35 | 50 |
| (9) | 35 | 55 |
| (10) | 20 | 30 |

In any sample other than the sample of Process Number (4), its copper oxide layer is equal to or less than 35 Å in thickness immediately after the copper oxide removing process and so it is known that the copper oxide layer has been removed.

As for the sample of Process Number (4), it is thought that its copper oxide has not been dissolved because of low concentration of the sulfuric acid solution which is as low as 0.005 normality. And as for the sample of Process Number (5), although a high-concentration of the sulfuric acid solution of 20 normality is used, there is little difference in the copper oxide removing effect between the sample of Process Number (5) and the samples of Process Numbers (1) to (3) and (6) to (10). Therefore, it is understood that the acid solution does not need to be so high in concentration.

On the other hand, in case of no neutralization process in the same way as the sample of Process Number (1), though the copper oxide film is thin in thickness immediately after the copper oxide removing process, oxidation of the copper film progresses so much that the film has become 100 Å in thickness 24 hours after the removing process. The reason is that a minute amount of acid is remained on the surface of the copper film due to no neutralization process though a washing process has been performed and this adsorbed or residual acid prompts oxidation as a catalyst.

Also in the sample of Process Number (2) which is not washed, it is known that oxidation has progressed 24 hours after the removing process. It is thought that the reason is that an alkali agent used in the neutralization process is remained on the surface of the copper film.

On the other hand, in the samples of Process Numbers (3) and (5) to (10), it is known that the copper oxide is effectively removed and furthermore oxidation is slow in progress even after being left in the air for 24 hours. The reason is that acid, neutralizing agents, and the like to act as a catalyst for oxidation have been removed.

Each of the above-mentioned samples was consecutively processed as using a spinner and as a result each series of the processes was finished in a short time of 45 to 65 seconds.

On the contrary, a method of dipping a sample in each solution without using a spinner was also tried. For example, in case of processing a sample by means of the dipping method under the same condition as the sample of Process Number (3), though a copper oxide film has been removed, oxidation caused by being left in the air after these processes was fast in progress. It is thought that the reason is that a large amount of acid and neutralizing solutions are respectively remained on the sample after the acid and neutralization processes.

Then, when the processing times in the treating process with acid, neutralizing process, and washing process were changed, respectively, to 20, 40, and 40 seconds, progress of oxidation after the processes became slow. As known from this, the processes using a dipping method are also effective, but they take a slightly longer time than the processes using a spinner. In case of using a dipping method, it is preferable to dry a sample as blowing nitrogen gas against it after finishing the washing process though this method takes a longer time.

When more examinations were made as changing solvents to be used in the acid, neutralization, and washing processes, changing a rotating speed of the spinner, or changing other conditions, the following results were obtained.

(i) A strong acid solution is preferable as an acid solution to be used for removing copper oxide, and either inorganic acid or organic acid such as sulfuric acid, nitric acid, hydrochloric acid, benzene sulfonic acid, toluene sulfonic acid, or the like will do.

An acid solution is insufficient in capability of dissolving copper oxide when it is too low in concentration, and on the other hand it may not only be uneconomical but also damage parts other than the copper film when it is unnecessarily high in concentration. According to our experiments, a weak acid solution which is less than 0.01 normality in concentration cannot dissolve copper oxide up to 50 Å in thickness for 5 minutes. Since a copper oxide film is often 100 Å or more in thickness on the surface of a copper film, it can be said that this weak acid solution is so insufficient in concentration that it may take too long time to remove copper oxide.

An acid solution of 10 normality in concentration is capable of removing a copper oxide film of about 100 Å in thickness for 10 seconds. However, since a speed of removing copper oxide was little changed even when the acid solution was increased up to 20 normality in concentration, an acid solution of 10 normality or less in concentration will do.

(ii) Neutralization is made by alkali or salt. Acid on the surface of a copper film is neutralized and removed by applying alkali or salt to the sample.

As an alkali agent for neutralization, such inorganic alkali as sodium hydroxide, potassium hydroxide, sodium hydrogencarbonate, sodium carbonate, potassium hydrogencarbonate, potassium carbonate, and the like, or such organic alkali as triethyl amine, trimethyl amine, pyridine, piperidine, tetramethyl ammonium hydroxide, and the like can be used. These alkali agents do not need to be particularly strong.

As a salt agent for neutralization, salt made from organic alkali and acid such as sulfate of triethyl amine, nitrate of triethyl amine, hydrochloride of triethyl amine, benzene sulfonate of triethyl amine, toluene sulfonate of triethyl amine, sulfate of trimethyl amine, nitrate of trimethyl amine, hydrochloride of trimethyl amine, benzene sulfonate of trimethyl amine, toluene sulfonate of trimethyl amine, sulfate of pyridine, nitrate of pyridine, hydrochloride of pyridine, benzene sulfonate of pyridine, toluene sulfonate of pyridine, sulfate of piperidine, nitrate of piperidine, hydrochloride of piperidine, benzene sulfonate of piperidine, toluene sulfonate of piperidine, and the like can be used.

A neutralizing solution does not have a definite standard value in relation to concentration as compared with an acid solution, but a neutralizing solution of 0.01 to 10 normality in concentration corresponding to the acid solution will do. And it is desired to use a dilute neutralizing solution when using a dilute acid solution and to use a concentration neutralizing solution when using a concentration acid solution.

(iii) An object of washing is to clean the surface of a copper film by thoroughly removing alkali or salt.

As a washing agent, pure water, or a kind of alcohol, ketone, aromatics, or ether can be used. For example, as a washing agent of a kind of alcohol, methanol, ethanol, and propanol can be used, and as a washing agent of a kind of ketone, methylethyl ketone and methylisobutyl ketone can be used, and as a washing agent of a kind of aromatics, toluene and xylene can be used, and as a washing agent of a kind of ether, propyl ether can be used.

Since moisture acts as a catalyst to promote oxidation of copper, it is important not to make moisture remain on the copper film after washing. When pure water is used for washing, it is necessary to remove the moisture or water with an organic solvent immediately after washing.

Therefore, washing with an organic solvent saves labor for removing moisture or water. And using a solvent whose boiling point is low makes shorter a drying time after washing.

From such a viewpoint as this, such solvents as methanol, ethanol, propanol, methylethyl ketone, and the like whose boiling points are 100° C. or lower are preferable as a washing agent.

In order to reduce still more the possibility of remaining moisture or water, an organic solvent instead of water is used as a solvent for an acid solution or neutralizing solution mentioned above. In this case, a kind of solvent which can dissolve a necessary amount of acid agent or neutralizing agent is selected. Since most of the inorganic alkali agents for neutralization are hard to dissolve into organic solvents, water is used in such cases.

(iv) In order to remove copper oxide more quickly, it is preferable to utilize a spinner used in developing photoresist.

In case of using a spinner, a copper film or a substrate for forming the printed wiring board is set on the spinner, and an acid solution, a neutralizing solution, and a washing solution are poured one after another or sequentially on the copper film as turning the spinner. Since an extra acid solution and an extra neutralizing solution are respectively removed in the neutralization and washing processes by the centrifugal force and reduced pressure caused by rotation based on the Bernoulli's law, on the whole the processes are finished in a short time. A too slow rotating speed of the spinner reduces such effect by half and a too fast rotating speed of it prevents each processing solution from spreading all over the copper film. Therefore, it is preferable for the spinner to be turned or rotated at a speed of 10 to 5000 rpm.

Furthermore, since a sample is dried by rotation of the spinner when supplying of the processing solution is stopped after washing, a drying process of blowing nitrogen gas can be omitted.

The above-mentioned copper film is not limited to a plate-shaped copper film, but it can be a copper film to be used as a wiring on a printed circuit board (an insulating substrate) or a thin copper film forming a interconnection in an LSI. In case of making a wiring of such a copper film, after the above-mentioned acid process, neutralization process, washing process, and drying process are finished, resist is applied onto the copper film and then a pattern of the resist is formed by exposing and developing it and after this the copper film is formed into the pattern by etching it as using the resist as a mask.

What is claimed is:

1. A method for removing copper oxide on the surface of a copper film, comprising the steps of:

disposing a copper film, having oxide on a surface thereof, on a turnable support with said oxide being exposed;

turning said support and said copper film to a first station at which the surface of a copper film is treated with an acid in order to remove copper oxide on the surface of the copper film;

turning said support and said copper film to a second station at which the surface of the copper film which has been treated with acid is neutralized; and then turning said support and said copper film to a third station at which the neutralized surface of the copper film is washed.

2. A method for removing copper oxide on the surface of a copper film of claim 1, which further comprises a process of drying the surface of the copper film by continuing to turn the copper film after the washing process.

3. A method for removing copper oxide on the surface of a copper film of claim 1, wherein an acid solution used in the treatment with acid comprises at least one of sulfuric acid, nitric acid, hydrochloric acid, benzene sulfonic acid, and toluene sulfonic acid.

4. A method for removing copper oxide on the surface of a copper film of claim 1, wherein an agent for using the neutralizing step comprises at least one of an inorganic alkali, an organic alkali, and a salt made from an organic alkali and an acid.

5. A method for removing copper oxide on the surface of a copper film of claim 4, wherein the inorganic alkali comprises at least one of sodium hydroxide, potassium hydroxide, sodium hydrogencarbonate, sodium carbonate, potassium hydrogencarbonate, and potassium carbonate.

6. A method for removing copper oxide on the surface of a copper film of claim 4, wherein the organic alkali comprises at least one of triethyl amine, trimethyl amine, pyridine, piperidine, and tetramethyl ammonium hydroxide.

7. A method for removing copper oxide on the surface of a copper film of claim 4, wherein the salt comprises at least one of sulfate of triethyl amine, nitrate of triethyl amine, hydrochloride of triethyl amine, benzene sulfonate of triethyl amine, toluene sulfonate of triethyl amine, sulfate of trimethyl amine, nitrate of trimethyl amine, hydrochloride of trimethyl amine, benzene sulfonate of trimethyl amine, toluene sulfonate of trimethyl amine, sulfate of pyridine, nitrate of pyridine, hydrochloride of pyridine, benzene sulfonate of pyridine, toluene sulfonate of pyridine, sulfate of piperidine, nitrate of piperidine, hydrochloride of piperidine, benzene sulfonate of piperidine, and toluene sulfonate of piperidine.

8. A method for removing copper oxide on the surface of a copper film as claimed in claim 1 wherein the concentration of at least one of the acid solution used for the acid treating process and the neutralizing solution used for the neutralization process is about 0.01 normal to 10 normal.

9. A method for removing copper oxide on the surface of a copper film as claimed in claim 1 wherein at least one of a solvent for an acid solution used for the acid treating process and a solvent for a neutralizing solution used for the neutralization process is an organic solvent.

10. A method for removing copper oxide on the surface of a copper film as claimed in claim 9 wherein at least one of said solvent for said acid solution used for the acid treating process and said solvent for said neutralizing solution used for the neutralization process and an organic solvent for a washing agent is at least one member selected from the group consisting of methanol, ethanol, propanol, methyl ethyl ketone, methyl isobutyl ketone, toluene, xylene or propyl ether.

11. A method for removing copper oxide on the surface of a copper film as claimed in claim 1 wherein a washing agent used for the washing process comprises at least one member selected from the group consisting of pure water and an organic solvent.

12. A method for removing copper oxide on the surface of a copper film as claimed in claim 11 wherein at least one of said solvent for said acid solution used for the acid treating process and said solvent for said neutralizing solution used for the neutralization process and said organic solvent for said washing agent is at least one member selected from the group consisting of methanol, ethanol, propanol, methyl ethyl ketone, methyl isobutyl ketone, toluene, xylene or propyl ether.

13. A method for patterning a copper film, comprising the steps of;

treating a surface of a copper film with an acid for removing copper oxide on a surface of the copper film formed on an insulating substrate;

neutralizing the surface of the copper film treated with the acid;

washing the neutralized surface of the copper film;

forming a mask on the washed copper film; and patterning the copper film by etching off a part of the copper film which is not covered with the mask.

14. A method for patterning a copper film as claimed in claim 13 wherein said copper film, comprising copper oxide on a surface thereof, disposed on said insulating substrate is disposed on a turnable support with said oxide surface being exposed; and wherein:

said method comprises the steps of:

turning said support and said copper film to a first station at which the surface of a copper film is treated with an acid in order to remove copper oxide on the surface of the copper film;

turning said support and said copper film to a second station at which the surface of the copper film which has been treated with acid is neutralized;

turning said support and said copper film to a third station at which the neutralized surface of the copper film is washed; and then forming said mask and patterning said copper film.

15. A method as claimed in claim 14 which further comprises drying said washed copper film prior to forming said mask.

16. A method as claimed in claim 13 wherein said acid is at least one member selected from the group consisting of sulfuric acid, nitric acid, hydrochloric acid, benzene sulfonic acid and toluene sulfonic acid in a concentration of about 0.01 to 10 normal, and wherein said neutralizing is accomplished by treatment with at least one member selected from the group consisting of sodium hydroxide, potassium hydroxide, sodium bicarbonate, sodium carbonate, potassium bicarbonate, potassium carbonate, triethyl amine, trimethyl amine, pyridine, piperidine and tetra methyl ammonium hydroxide in a concentration of about 0.01 to 10 normal.

* * * * *